US009100018B2

(12) United States Patent  
Lee et al.

(10) Patent No.: US 9,100,018 B2  
(45) Date of Patent: Aug. 4, 2015

(54) GATE DRIVER CIRCUIT FOR INDUCTIVE LOAD, INVERTER MODULE, AND INVERTER APPARATUS HAVING THE SAME

(75) Inventors: Jun Ho Lee, Gyunggi-do (KR); Bum Seok Suh, Gyunggi-do (KR); Kee Ju Um, Gyunggi-do (KR)

(73) Assignee: SAMSUNG ELECTRO-MECHANICS CO., LTD., Suwon (KR)

( * ) Notice: Subject to any disclaimer, the term of this patent is extended or adjusted under 35 U.S.C. 154(b) by 255 days.

(21) Appl. No.: 13/620,488

(22) Filed: Sep. 14, 2012

(65) Prior Publication Data

US 2014/0003107 A1 Jan. 2, 2014

(30) Foreign Application Priority Data

Jul. 2, 2012 (KR) ........................ 10-2012-0071844

(51) Int. Cl.
*H03K 17/687* (2006.01)

(52) U.S. Cl.
CPC .. *H03K 17/6871* (2013.01); *H01L 2224/48091* (2013.01); *H01L 2224/48137* (2013.01); *H01L 2224/48247* (2013.01); *H01L 2224/49171* (2013.01); *H01L 2224/49175* (2013.01); *H01L 2924/1305* (2013.01); *H01L 2924/13055* (2013.01); *H03K 2217/0063* (2013.01);

(Continued)

(58) Field of Classification Search
CPC ... H02M 1/32; H03K 17/6871; H03K 17/162; H03K 17/04123
USPC ............... 363/16, 37, 55, 71, 95, 97–98, 120, 363/131–132, 144, 147
See application file for complete search history.

(56) References Cited

U.S. PATENT DOCUMENTS 5,773,883 A * 6/1998 Majumdar et al. ............. 257/698  
6,794,742 B2 * 9/2004 Kawafuji et al. ............. 257/690

(Continued)

FOREIGN PATENT DOCUMENTS

CN 1723559 A 1/2006  
CN 101488496 A 7/2009

(Continued)

OTHER PUBLICATIONS

Korean Office Action issued in Application No. 10-2012-0071844 dated Aug. 1, 2013.

(Continued)

*Primary Examiner* — Timothy J Dole  
*Assistant Examiner* — Yusef Ahmed  
(74) *Attorney, Agent, or Firm* — McDermott Will & Emery LLP

(57) ABSTRACT

A gate driver circuit applicable to an inductive load, an inverter module, and an inverter apparatus are provided. The gate driver circuit includes a high side driver having a first output side and a first control side and generating a high side gate signal; and a low side driver generating a low side gate signal, wherein the high side driver includes a first VS pad formed on the first output side; a first output pad formed on the first output side, a first VB pad formed on the first control side; and a second VB pad formed to be adjacent to the first VB pad on the first control side and electrically connected to the first VS pad; and a first circuit unit connected to the plurality of pads to provide the high side gate signal through the first output pad.

25 Claims, 6 Drawing Sheets

(52) U.S. Cl.
CPC  *H03K2217/0072* (2013.01); *H03K 2217/0081* (2013.01)

(56) References Cited

U.S. PATENT DOCUMENTS

| | | | |
|---|---|---|---|
| 7,298,027 B2* | 11/2007 | Yea et al. | 257/666 |
| 7,635,962 B2* | 12/2009 | Suh | 318/801 |
| 7,948,204 B2* | 5/2011 | Palma et al. | 318/798 |
| 8,027,183 B2* | 9/2011 | Cho et al. | 363/131 |
| 8,044,468 B2* | 10/2011 | Uno et al. | 257/368 |
| 8,207,558 B2* | 6/2012 | Shiraishi et al. | 257/268 |
| 2004/0227547 A1 | 11/2004 | Shiraishi et al. | |
| 2006/0006432 A1* | 1/2006 | Shiraishi et al. | 257/288 |
| 2007/0008679 A1 | 1/2007 | Takahasi et al. | |
| 2007/0052379 A1* | 3/2007 | Suh | 318/254 |
| 2008/0002445 A1* | 1/2008 | Cho et al. | 363/131 |
| 2009/0179235 A1* | 7/2009 | Shiraishi et al. | 257/288 |
| 2010/0164419 A1* | 7/2010 | Suh | 318/400.27 |

FOREIGN PATENT DOCUMENTS

| | | |
|---|---|---|
| JP | 2000-138343 A | 5/2000 |
| KR | 2005-0101725 A | 10/2005 |

OTHER PUBLICATIONS

Fairchild Semiconductor Application Note 42037-ML4423 Application Guidelines, dated Apr. 1998, 19 pgs.
Extended European Search Report issued in corresponding European Application No. 12275150.6, dated Jun. 6, 2014.
Chinese Office Action issued in Chinese Applciation No. 2012103657444, dated Apr. 20, 2015, with English translation.

* cited by examiner

US 9,100,018 B2

GATE DRIVER CIRCUIT FOR INDUCTIVE LOAD, INVERTER MODULE, AND INVERTER APPARATUS HAVING THE SAME

CROSS-REFERENCE TO RELATED APPLICATIONS

This application claims the priority of Korean Patent Application No. 10-2012-0071844 filed on Jul. 2, 2012, in the Korean Intellectual Property Office, the disclosure of which is incorporated herein by reference.

BACKGROUND OF THE INVENTION

1. Field of the Invention

The present invention relates to a gate driver circuit applicable to an inductive load such as a motor, or the like, an inverter module, and an inverter apparatus.

2. Description of the Related Art

In general, in order to supply a driving signal to an inductive load used in an electric product such as an electric vehicle, or the like, an inverter converting a DC voltage into an AC voltage may be used, and in order to drive the inverter, a gate driver generating a gate signal is required. Here, the inductive load may include a motor, a heating coil, and the like.

In general, an inverter includes a high side switch and a low side switch to generate an AC voltage. The high side switch and the low side switch are complementarily switched in each phase, and an insulated gate bipolar transistor (IGBT) element may be used as the high side switch and the low side switch.

The gate driver includes a high side driver IC (e.g., high voltage integrated circuit (HVIC)) for driving the high side switch and a low side driver IC (e.g., low voltage integrated circuit (LVIC)) for driving the low side switch.

The inverter and the gate driver may be configured as an IC, respectively, and manufactured as a single inverter module, and a pad of the gate driver and a pad of the inverter may be connected through a wire or a lead frame. Such an inverter module may be mounted on a printed circuit board (PCB) to form a PCB board assembly (PBA).

When a PBA is designed by using an inverter power module (hereinafter referred to as an 'inverter module'), the following matters should be taken into consideration. First, in order to drive a high side IGBT operable at a high voltage, a potential difference greater than an emitter terminal by an amount equal to a turn-on voltage should be made between a gate terminal and the emitter terminal of the high side IGBT. Also, when a low voltage (e.g., 0V) is applied to the emitter terminal (connected to a VS terminal), a turn-on voltage may be applied to the gate terminal (connected to an H0 terminal and a VB terminal), but when a high voltage (e.g., 300V) is applied to the emitter terminal, a voltage (e.g., 300V+turn-on voltage) higher than the high voltage by an amount equal to the turn-on voltage should be applied. To this end, a bootstrap capacitor is required between the VB terminal and the VS terminal of the high side driver IC (i.e., HVIC).

Here, however, the VB terminal and the VS terminal are formed on the opposing sides, so in order to connect the bootstrap between the two terminals, a line connected to the VB terminal is required to be formed up to the VB terminal formed on the opposite side to connect the bootstrap capacitor, complicating a PCB design and increasing the size of the PCB.

Thus, a lead frame of the inverter module or a pattern on a substrate are lengthened and complicated, and since a space between the substrate and the board is increased, the design of the substrate is complicated, and due to the complicated lead frame and pattern, noise is highly likely to be introduced.

Patent document 1, the Prior art document below, relates to an inverter driving apparatus for controlling a behavior of a brushless DC (BLDC) motor applied to an electric vehicle using a 42V power system. However, this document does not disclose technical matters regarding an addition of a VS pad in designing a high side driver (i.e., an HVIC) aimed at simply manufacturing a PCB or technical matters regarding positions in which an added VS pad and VB pad are formed.

Prior Art Document (Patent document 1) Korean Patent Laid Open Publication No. 10-2005-0101725

SUMMARY OF THE INVENTION

An aspect of the present invention provides a gate driver circuit including a high side driver (e.g., a high voltage integrated circuit (HVIC)) designed to add a VS pad such that the VS pad is adjacent to a VB pad, an inverter module in which a VS pin is additionally formed in a position adjacent to a VB pin, thereby facilitating and simplifying a design of a printed circuit board (PCB) on which the inverter module is mounted and reducing a size of the PCB, and an inverter apparatus including the same.

According to a first aspect of the present invention, there is provided a gate driver circuit including: a high side driver having a first output side including a certain amount of a plurality of pads formed therein and a first control side positioned on the side opposite to the first output side and including the remainder of the plurality of pads formed therein, and generating a high side gate signal; and a low side driver generating a low side gate signal by interworking with the high side driver, wherein the high side driver includes a first VS pad formed on the first output side; a first output pad formed on the first output side; a first VB pad formed on the first control side; and a second VS pad formed to be adjacent to the first VB pad on the first control side and electrically connected to the first VS pad; and a first circuit unit connected to the plurality of pads including the first VB pad, the first output pad, the first VS pad, and the second VS pad, and providing the high side gate signal through the first output pad.

According to a second aspect of the present invention, there is provided an inverter module including: a gate driver circuit including a high side driver having a first output side including a certain amount of a plurality of pads formed therein and a first control side positioned on the side opposite to the first output side and including the remainder of the plurality of pads formed therein, and generating a high side gate signal, and a low side driver generating a low side gate signal by interworking with the high side driver; and an inverter including a high side switch circuit driven by the high side gate signal and a low side switch circuit driven by the low side gate signal, wherein the high side driver includes a first VS pad formed on the first output side; a first output pad formed on the first output side, a first VB pad formed on the first control side; a second VS pad formed to be adjacent to the first VB pad on the first control side and electrically connected to the first VS pad; and a first circuit unit connected to the plurality of pads including the first VB pad, the first output pad, the first VS pad, and the second VS pad, and providing the high side gate signal through the first output pad.

According to a third aspect of the present invention, there is provided an inverter apparatus including: an inverter module generating a driving signal of an inductive load; and a printed circuit board on which the inverter module is mounted, wherein the inverter module includes: a gate driver circuit including a high side driver having a first output side including a certain amount of a plurality of pads formed therein and a first control side positioned on the side opposite to the first output side and including the remainder of the plurality of pads formed therein, and generating a high side gate signal, and a low side driver generating a low side gate signal by interworking with the high side driver; and an inverter including a high side switch circuit driven by the high side gate signal and a low side switch circuit driven by the low side gate signal, wherein the high side driver includes a first VS pad formed on the first output side; a first output pad formed on the first output side; a first VB pad formed on the first control side; a second VS pad formed to be adjacent to the first VB pad on the first control side and electrically connected to the first VS pad; and a first circuit unit connected to the plurality of pads including the first VB pad, the first output pad, the first VS pad, and the second VS pad, and providing the high side gate signal through the first output pad.

In the first, second, and third aspects of the present invention, the low side driver may include: a second output side including a certain amount of a plurality of pads formed therein; a second control side positioned on the side opposite to the second output side and including the remainder of the plurality of pads formed therein; a second output pad formed on the second output side; and a second circuit unit connected to the plurality of pads including the second output pad and providing the low side gate signal through the second output pad.

The first VS pad may include three first VS pads having a U phase, a V phase, and a W phase corresponding to a U phase, a V phase, and a W phase of a 3-phase inductive load, respectively, the first output pad may include three first output pads having a U phase, a V phase, and a W phase, the first VB pad may include three first VB pads having a U phase, a V phase, and a W phase, and the second VS pad may include three second VS pads formed to be adjacent to the three first VB pads having the U phase, the V phase, and the W phase and electrically connected thereto, respectively.

The circuit unit may include: a first circuit unit connected to the U-phase first VB pad, first output pad, first VS pad, and second VS pad and providing a high side first gate signal, among the high side gate signals, through the U-phase first output pad; a second circuit unit connected to the V-phase first VB pad, first output pad, first VS pad, and second VS pad and providing a high side second gate signal, among the high side gate signals, through the V-phase first output pad; and a third circuit unit connected to the W-phase first VB pad, first output pad, first VS pad, and second VS pad and providing a high side third gate signal, among the high side gate signals, through the W-phase first output pad.

The high side switch circuit may include: a high side first switch driven by the high side first gate signal; a high side second switch driven by the high side second gate signal; and a high side third switch driven by the high side third gate signal.

The first circuit unit may include a first switch element formed between the U-phase first VB pad and the U-phase first output pad and a second switch element formed between the U-phase first output pad and the U-phase first VS pad, the second circuit unit may include a third switch element formed between the V-phase first VB pad and the V-phase first output pad and a fourth switch element formed between the V-phase first output pad and the V-phase first VS pad, and the third circuit unit may include a fifth switch element formed between the W-phase first VB pad and the W-phase first output pad and a sixth switch element formed between the W-phase first output pad and the W-phase first VS pad.

In the second and third aspects of the present invention, the inverter module may include: a plurality of lead frames electrically connected to the plurality of pads including the first VB pad, the first output pad, the first VS pad, and the second VS pad through conducting wires, respectively; and a plurality of pins directly electrically connected to the plurality of lead frames, respectively, and formed in an end portion of the inverter module.

The first and second lead frames connected to the U-phase first VB pad and second VS pad, respectively, among the plurality of lead frames, may be formed in adjacent positions, the third and fourth lead frames connected to the V-phase first VB pad and second VS pad, respectively, among the plurality of lead frames, may be formed in adjacent positions, and the fifth and sixth lead frames connected to the W-phase first VB pad and second VS pad, respectively, among the plurality of lead frames, may be formed in adjacent positions.

First and second pins connected to the first and second lead frames, respectively, among the plurality of pins, may be formed in adjacent positions, third and fourth pins connected to the third and fourth lead frames, respectively, among the plurality of pins, may be formed in adjacent positions, and fifth and sixth pins connected to the fifth and sixth lead frames, respectively, among the plurality of pins, may be formed in adjacent positions.

In the third aspect of the present invention, the PCB may include: a plurality of pin holes into which the plurality of pins are inserted to be electrically connected; first to sixth conductor patterns electrically connected to first to sixth pin holes, respectively, among the plurality of pin holes; and first to sixth insertion holes electrically connected to the first to sixth conductor patterns.

The PCB may include: a first bootstrap capacitor inserted into the first and second insertion holes so as to be electrically connected to the first and second conductor patterns; a second bootstrap capacitor inserted into the third and fourth insertion holes so as to be electrically connected to the third and fourth conductor patterns; and a third bootstrap capacitor inserted into the fifth and sixth insertion holes so as to be electrically connected to the fifth and sixth conductor patterns.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
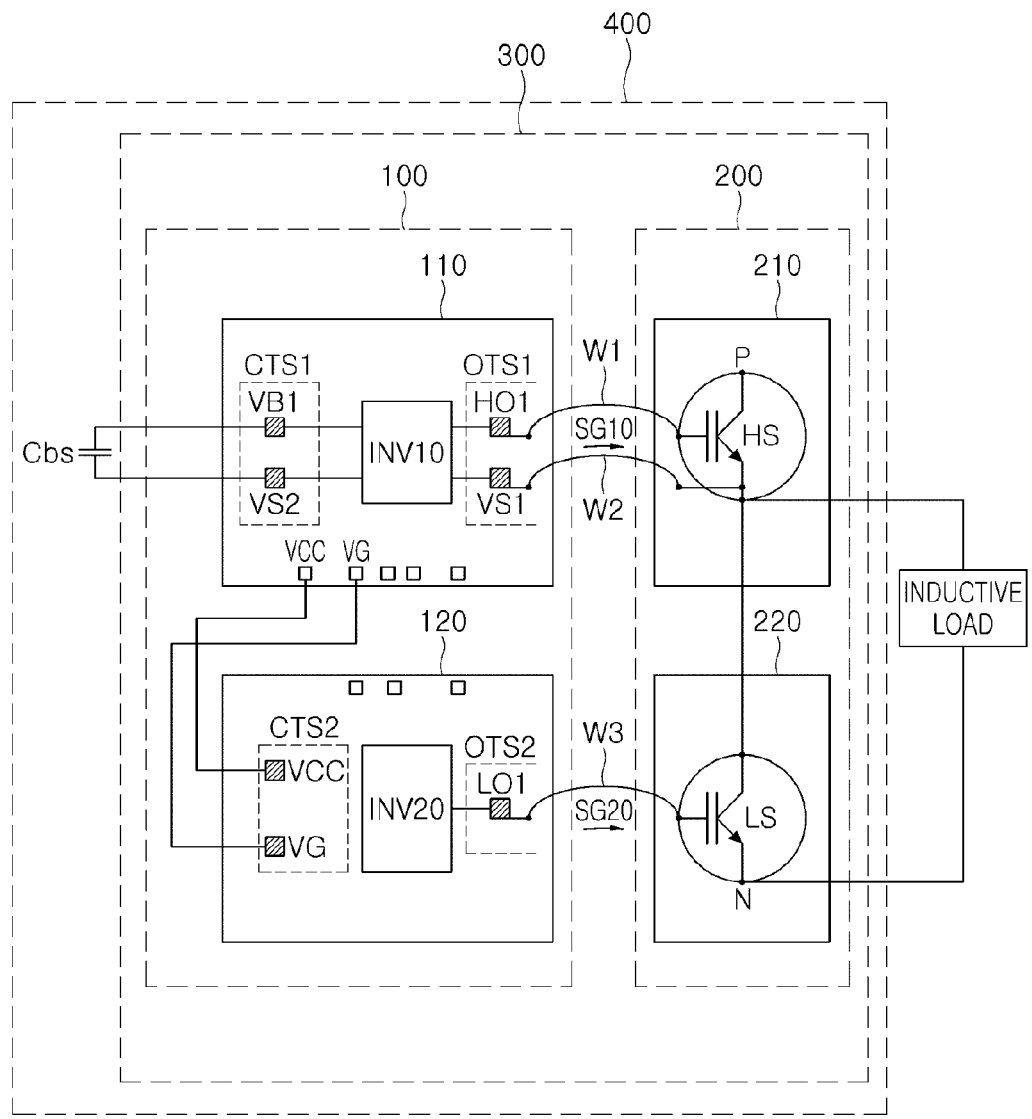
FIG. 1 is a block diagram of an inverter apparatus according to an embodiment of the present invention.

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

FIG. 1 is a block diagram of an inverter apparatus according to an embodiment of the present invention. Referring to FIG. 1, an inverter apparatus according to an embodiment of the present invention may include an inverter module 300 driving a driving signal of an inductive load, and a printed circuit board (PCB) 400 on which the inverter module 300 is mounted.

The inverter module 300 may include a gate driver circuit 100 generating high side and low side gate signals SBG10 and SG20 and an inverter 200 driven by the high side and low side gate signals SG10 and SG20 to generate a driving signal of an inductive load and providing the generated driving signal to the inductive load. Also, the inverter module 300 may be mounted on the PCB 400.

The gate driver circuit 100 may include a high side driver 110 having a first output side OTS1 having a certain amount of a plurality of pads formed therein and a first control side CTS1 positioned on the side opposite to the first output side OTS1, having the remainder of the plurality of pads formed therein, and generating a high side gate signal SG10, and a low side driver 120 generating a low side gate signal SG20 by interworking with the high side driver 110.

The inverter 200 may include a high side switch circuit 210 driven by the high side gate signal SG10 and a low side switch circuit 220 driven by the low side gate signal SG20.

Here, the high side driver 110 may generate the high side gate signal SG10 and provide the generated high side gate signal SG10 to the high side switch circuit 210.

Also, the low side driver 120 may generate the low side gate signal SG20 by interworking with the high side driver 110, and provide the generated low side gate signal SG20 to the low side switch circuit 220.

The high side driver 110 may include a first VS pad VS1 formed on the first output side OTS1, a first output pad HO1 formed on the first output side OTS1, a first VB pad VB1 formed on the first control side CTS1, a second VS pad VS2 formed to be adjacent to the first VB pad VB1 on the first control side CTS1 and electrically connected to the first VS pad VS1, and a first circuit unit INV10 connected to the plurality of pads including the first VB pad VB1, the first output pad HO , the first VS pad VS1, and the second VS pad VS2, and providing the high side gate signal SG10 through the first output pad HO1.

Namely, the second VS pad VS2 is electrically connected to the first VS pad VS1 formed on the first output side OTS1. Unlike the first VS pad VS1, the second VS pad VS2 is formed on the first control side CTS1, and in particular, the first VB pad VB1 and the second VS pad VS2 are formed to be adjacent to one another, but a bootstrap capacitor Cbs may easily be electrically connected between the first VB pad VB1 and the second VS pad VS2. This will be described in detail hereinafter.

For example, the high side switch circuit 210 may include an IGBT (HS), and a collector of the IGBT (HS) may be connected to a power source (P), a gate of the IGBT (HS) may be connected to a first output pad HO1 of the high side driver 110 through a conducting wire W1, and an emitter of the IGBT (HS) may be connected to the first VS pad VS1 of the high side driver 110. The emitter of the IGBT (HS) may be connected to an inductive load.

In this case, the first circuit unit INV10 may generate the high side gate signal SG10 and provide the generated high side gate signal SG10 to the high side switch circuit 210 through the first output pad HO1.

The low side driver 120 may include a second output side OTS2 including a certain amount of a plurality of pads formed therein, a second control side CTS2 positioned on the side opposite to the second output side OTS2 and including the remainder of the plurality of pads formed therein, a second output pad LO1 formed on the second output side OTS2, and a second circuit unit INV20 connected to the plurality of pads including the second output pad LO1 and providing the low side gate signal SG20 through the second output pad LO1.

For example, the low side switch circuit 220 may include an IGBT (LS), and a collector of the IGBT (LS) may be connected to the emitter of the IGBT (HS), a gate of the IGBT (LS) may be connected to the second output pad LO1 of the low side driver 120 through a conducting wire W3, and an emitter of the IGBT (LS) may be connected to the inductive load. Here, the inductive load may be a motor or a heating coil.

In this case, the second circuit unit INV20 may generate the low side gate signal SG20 and provide the generated low side gate signal SG20 to the low side switch circuit 220 through the second output pad LO1.

Also, the plurality of pads of the high side driver 110 may include a VCC pad and a VG pad, and the plurality of pads of the low side driver 120 may also include a VCC pad and a VG pad. The VCC pad of the high side driver 110 may be electrically connected to the VCC pad of the low side driver 120, and the VG pad of the high side driver 110 may be electrically connected to the VG pad of the low side driver 120.

Figure 2:
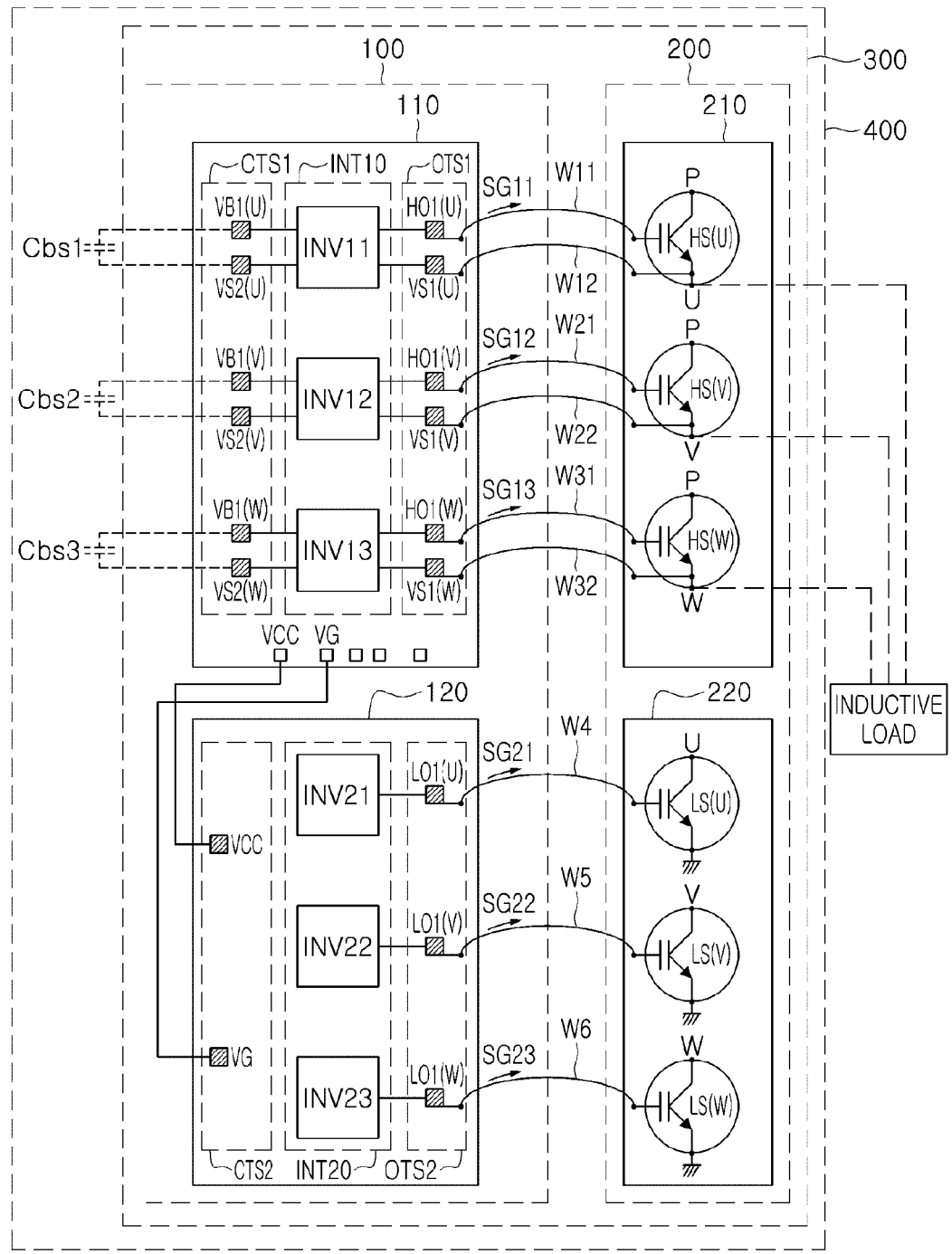
FIG. 2 is a detailed block diagram of the inverter apparatus according to an embodiment of the present invention.

FIG. 2 is a detailed block diagram of the inverter apparatus according to an embodiment of the present invention.

Referring to FIG. 2, the first VS pad VS1 includes three first VS pads VS1 (U), VS1 (V), and VS1 (W) having a U phase, a V phase, and a W phase corresponding to a U phase, a V phase, and a W phase of a 3-phase inductive load. The first output pad HO1 three first output pads HO1 (U), HO1 (V), and HO1 (W) having a U phase, a V phase, and a W phase. The first VB pad VB1 includes three first VB pads VB1(U), VB1 (V), and VB1(W) having a U phase, a V phase, and a W phase. The second VS pad VS2 may include three second VS pads VS2(U), VS2(V), and VS2(W) having a U phase, a V phase, and a W phase. The three second VS pads VS2(U), VS2(V), and VS2(W) of the second VS pad VS2 are formed to be adjacent to the three first VB pads VB1(U), VB1(V), and VB1(W) having the U phase, the V phase, and the W phase and electrically connected to the three first VS pads VS1(U), VS1(V), and VS1(W) having the U phase, the V phase, and the W phase, respectively. Here, the three-phase inductive load may be a motor.

Namely, the second VS pads VS2(U), VS2(V), and VS2 (W) having the U phase, the V phase, and the W phase are electrically connected to the first VS pads VS1(U), VS1(V), and VS1(W) having the U phase, the V phase, and the W phase formed on the first output side OTS1, respectively. Here, unlike the first VS pads VS1(U), VS1(V), and VS1(W)

having the U phase, the V phase, and the W phase, the second VS pads VS2(U), VS2(V), and VS2(W) having the U phase, the V phase, and the W phase are formed on the first control side CTS1.

In particular, since the first VB pads VB1(U), VB1(V), VB1(W) having the U phase, the V phase, and the W phase and the second VS pads VS2(U), VS2(V), and VS2(W) having the U phase, the V phase, and the W phase are formed to be adjacent, respectively, a first bootstrap capacitor Cbs1 may easily be electrically connected between the U-phase first VB pad VB1(U) and the U-phase second VS pad VS2(U), a second bootstrap capacitor Cbs2 may easily be electrically connected between the V-phase first VB pad VB1(V) and the V-phase second VS pad VS2(V), and a third bootstrap capacitor Cbs3 may easily be electrically connected between the W-phase first VB pad VB1(W) and the W-phase second VS pad VS2(W). This will be described in detail hereinafter.

The circuit unit INV may include three circuit units, i.e., a first circuit unit IINV11, a second circuit unit INV12, and a third circuit unit INV13 having a U phase, a V phase, and a W phase, respectively.

The first circuit unit INV11 may be connected to the U-phase first VB pad VB1(U), the first output pad HO1 (U), the first VS pad VS1(U), and the second VS pad VS2(U), and provide a high side first gate signal SG11, among the high signal gate signals SG10, through the U-phase first output pad HO1 (U).

The second circuit unit INV12 may be connected to the V-phase first VB pad VB1(V), the first output pad HO1 (V), the first VS pad VS1(V), and the second VS pad VS2(V), and provide a high side second gate signal SG12, among the high signal gate signals SG10, through the V-phase first output pad HO1 (V).

The third circuit unit INV13 may be connected to the W-phase first VB pad VB1(W), the first output pad HO1 (W), the first VS pad VS1(W), and the second VS pad VS2(W), and provide a high side third gate signal SG13, among the high signal gate signals SG10, through the W-phase first output pad HO1 (W).

The high side switch circuit 210 may include a high side first switch HS(U) driven by the high side first gate signal SG11, a high side second switch HS(V) driven by the second gate signal SG12, and a high side third switch HS(W) driven by the high side third gate signal SG13.

For example, the high side first, second, and third switches HS(U), HS(V), and HS(W) may be configured as high side first, second, and third IGBTs HS(U), HS(V), and HS(W), respectively. Collectors of the high side first, second, and third IGBTs HS(U), HS(V), and HS(W) may be connected to the power source P, respectively. Gates of the high side first, second, and third IGBTs HS(U), HS(V), and HS(W) may be connected to the first output pads HO1 (U), HO1 (V), and HO1 (W) having the U phase, the V phase, and the W phase of the high side driver 110 through the conducting wires W11, W12, and W13, respectively. Emitters of the high side first, second, and third IGBTs HS(U), HS(V), and HS(W) may be connected to the first VS pads VS1(U), S1(V), and VS1(W) having the U phase, the V phase, and the W phase of the high side driver 110 through the conducting wires W12, W22, and W32, respectively. Also, the emitters of the high side first, second, and third IGBTs HS(U), HS(V), and HS(W) may be connected to the inductive load, respectively.

In this case, the first circuit unit INV11 may provide the first gate signal SG11 to the high side first switch HS(U) through the U-phase first output pad HO1 (U).

The second circuit unit INV12 may provide the second gate signal SG12 to the high side second switch HS(V) through the V-phase first output pad HO1 (V).

The third circuit unit INV13 may provide the third gate signal SG13 to the high side second switch HS(W) through the W-phase first output pad HO1 (W).

The low side switch circuit 220 may include a low side first switch LS(U) driven by a low side first gate signal SG21, a low side second switch LS(V) driven by a low side second gate signal SG22, and a low side third switch LS(W) driven by a low side third gate signal SG23.

For example, the low side first, second, and third switches LS(U), LS(V), and LS(W) may be configured as first, second, and third IGBTs LS(U), LS(V), and LS(W). Collectors of the low side first, second, and third IGBTs LS(U), LS(V), and LS(W) may be connected to the emitters of the first, second, and third IGBTs HS(U), HS(V), and HS(W), respectively, gates of the low side first, second, and third IGBTs LS(U), LS(V), and LS(W) may be connected to the second output pads LO1(U), LO1(V), and LO1(W) having the U phase, the V phase, and the W phase of the low side driver 120 through conducting wires W4, W5, and W6, respectively, and emitters of the low side first, second, and third IGBTs LS(U), LS(V), and LS(W) may be connected to a power ground, respectively.

Also, the plurality of pads of the high side driver 110 may include a VCC pad and a VG pad, and the plurality of pads of the low side driver 120 may also include a VCC pad and a VG pad. The VCC pad of the high side driver 110 may be electrically connected to the VCC pad of the low side driver 120, and the VG pad of the high side driver 110 may be electrically connected to the VG pad of the low side driver 120.

Figure 3:
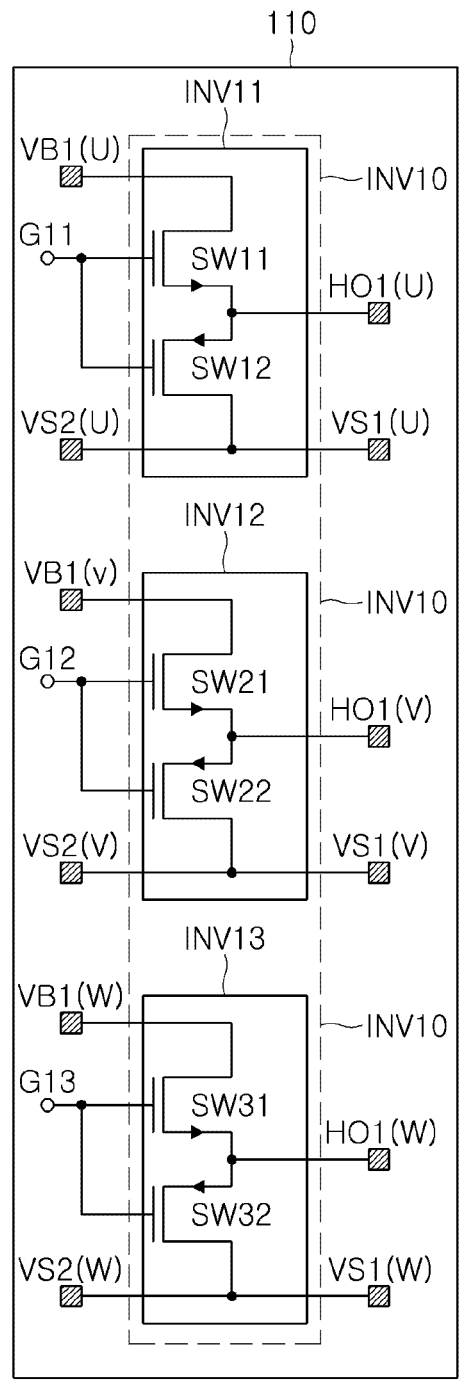
FIG. 3 is an internal circuit diagram of a high side driver according to an embodiment of the present invention.

FIG. 3 is an internal circuit diagram of the high side driver according to an embodiment of the present invention.

Referring to FIGS. 2 and 3, the first circuit unit INV11 may include a first switch element SW11 formed between the U-phase first VB pad VB1(U) and the U-phase first output pad HO1 (U), and a second switch element SW12 formed between the U-phase first output pad HO1 (U) and the U-phase first VS pad VS1(U). Here, the first and second switch elements SW11 and SW12 may be configured as FET transistors complementarily operating according to a signal through the first gate terminal G11.

In this case, when the first switch SW11 is turned on and the second switch element SW12 is turned off, the U-phase first VB pad VB1(U) is electrically connected to the first output pad HO1 (U), and when the first switch element SW11 is turned off and the second switch element SW12 is turned on, the U-phase first and second VS pads VS1(U) and VS2(U) are electrically connected to the U-phase first output pad HO1 (U).

Also, referring to FIG. 3, the second circuit unit INV12 may include a third switch element SW21 formed between the V-phase first VB pad VB1(V) and the V-phase first output pad HO1 (V), and a fourth switch element SW22 formed between the V-phase first output pad HO1 (V) and the V-phase first VS pad VS1(V). Here, the third and fourth switch elements SW21 and SW22 may be configured as FET transistors complementarily operating according to a signal through the second gate terminal G12.

In this case, when the third switch SW21 is turned on and the fourth switch element SW22 is turned off, the V-phase first VB pad VB1(V) is electrically connected to the first output pad HO1 (V), and when the third switch element SW21 is turned off and the fourth switch element SW22 is turned on, the V-phase first and second VS pads VS1(V) and VS2(V) are electrically connected to the V-phase first output pad HO1 (V).

Also, referring to FIG. 3, the third circuit unit INV13 may include a fifth switch element SW31 formed between the W-phase first VB pad VB1(W) and the W-phase first output pad HO1 (W), and a sixth switch element SW32 formed between the W-phase first output pad HO1 (W) and the W-phase first VS pad VS1(W). Here, the fifth and sixth switch elements SW31 and SW32 may be configured as FET transistors complementarily operating according to a signal through the third gate terminal G13.

In this case, when the fifth switch SW31 is turned on and the sixth switch element SW32 is turned off, the W-phase first VB pad VB1(W) is electrically connected to the first output pad HO1 (W), and when the fifth switch element SW31 is turned off and the sixth switch element SW32 is turned on, the W-phase first and second VS pads VS1(W) and VS2(W) are electrically connected to the W-phase first output pad HO1 (W).

As described above, the U-phase first output pad HO1 (U) and the U-phase second VS pad VS2(U) may be formed in mutually adjacent positions, the V-phase first output pad HO1 (V) and the V-phase second VS pad VS2(V) may be formed in mutually adjacent positions, and the W-phase first output pad HO1 (W) and the W-phase second VS pad VS2(W) may be formed in mutually adjacent positions.

Accordingly, as described hereinafter, associated pins among a plurality of pins of the inverter 300 may be formed in mutually adjacent positions.

Figure 4:
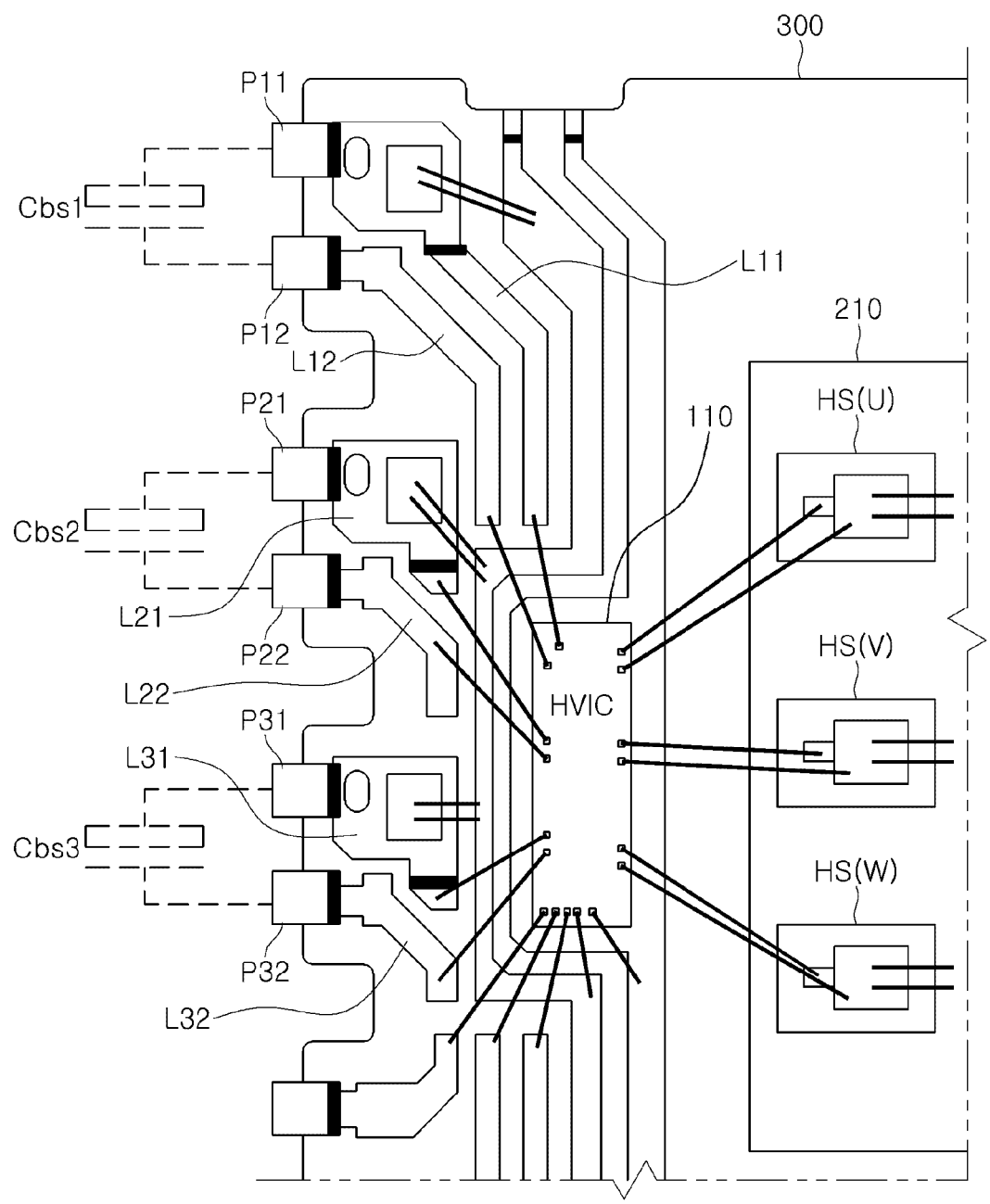
FIG. 4 is a layout view of an inverter module according to an embodiment of the present invention.

FIG. 4 is a layout view of the inverter module according to an embodiment of the present invention.

Referring to FIGS. 2 through 4, the inverter module 300 may include a plurality of lead frames L11, L12, L21, L22, L31, and L32 electrically connected to the plurality of pads including the first VB pad VB1, the first output pad HO 1, the first VS pad VS1, and the second VS pad V32 through conducting wires, respectively, and a plurality of pins P11, P12, P21, P22, P31, and P32 directly electrically connected to the plurality of lead frames, respectively, and formed on end portions of the inverter module 300.

In particular, referring to FIG. 4, in the inverter module 300, the first and second lead frames L11 and L12 connected to the U-phase first VB pad VB1(U) and the second VS pad VS2(U), among the plurality of lead frames, may be formed in adjacent positions.

Also, the third and fourth lead frames L21 and L22 connected to the V-phase first VB pad VB1(V) and the second VS pad VS2(V), among the plurality of lead frames, may be formed in adjacent positions.

Also, the fifth and sixth lead frames L31 and L32 connected to the W-phase first VB pad VB1(W) and the second VS pad VS2(W), among the plurality of lead frames, may be formed in adjacent positions.

Also, referring to FIG. 4, in the inverter module 300, the first and second pins P11 and P12 connected to the first and second lead frames L11 and L12, among the plurality of pins, may be formed in adjacent positions.

Also, the third and fourth pins P21 and P22 connected to the third and fourth lead frames L21 and L22, among the plurality of pins, may be formed in adjacent positions.

Also, the fifth and sixth pins P31 and P32 connected to the fifth and sixth lead frames L31 and L32, among the plurality of pins, may be formed in adjacent positions.

Figure 5:
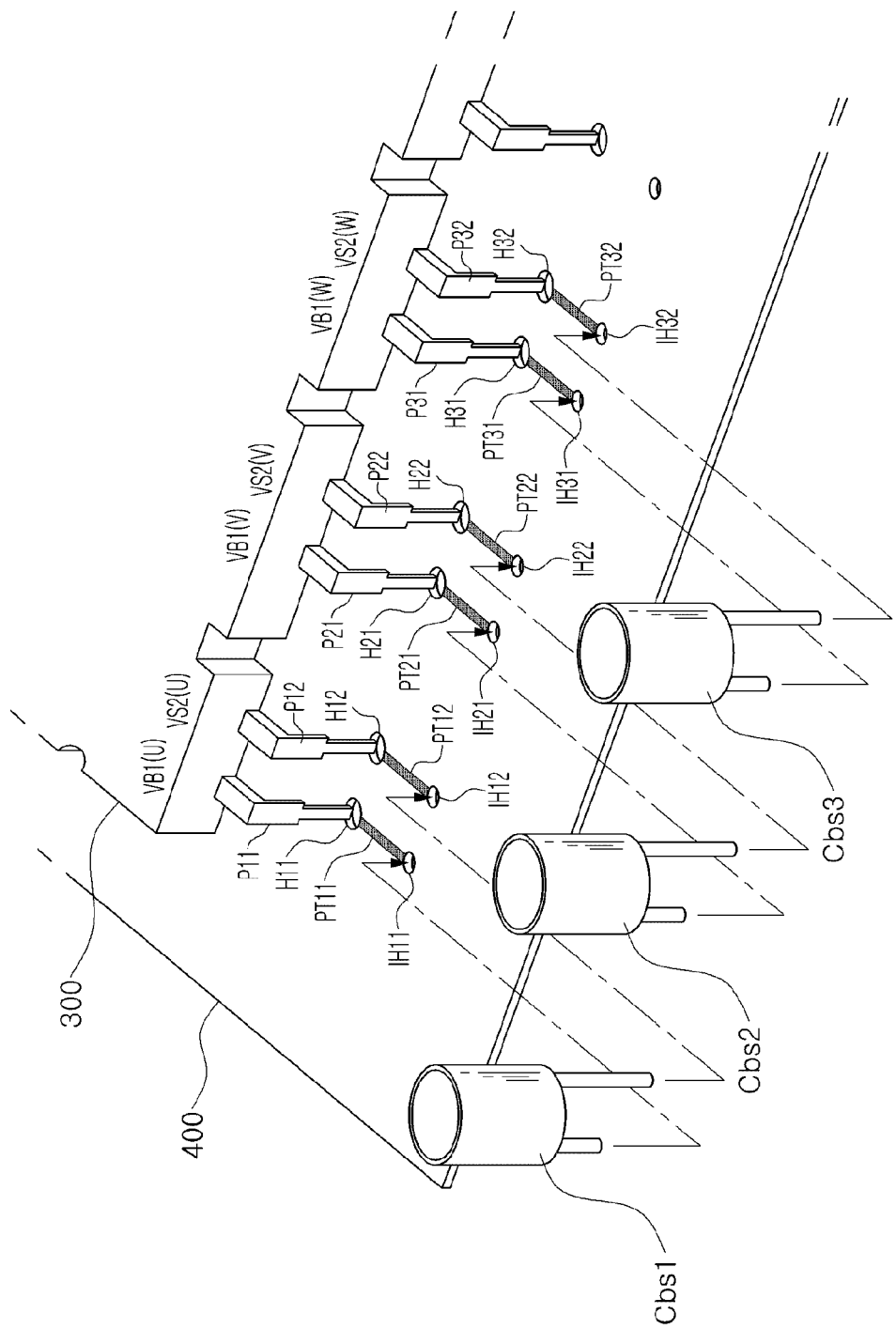
FIG. 5 is a view illustrating a connection structure of the inverter apparatus according to an embodiment of the present invention.

FIG. 5 is a view illustrating a connection structure of the inverter apparatus according to an embodiment of the present invention.

Referring to FIGS. 2 through 5, the PCB 400 may include a plurality of pin holes in which a plurality of pins are inserted so as to be electrically connected, first to sixth conductor patterns PT11, PT12, PT21, PT22, PT31, and PT32 being electrically connected to first to sixth pin holes H11, H12, H21, H22, H31, and H32, respectively, among the plurality of pin holes, and first to sixth insertion holes IH11, IH12, IH21, IH22, IH31, and IH32 being electrically connected to the first to sixth conductor patterns PT11, PT12, PT21, PT22, PT31, and PT32, respectively.

Here, among the first to sixth pin holes H11, H12, H21, H22, H31, and H32, the first and second pin holes H11 and H12 may be formed in adjacent positions, the third and fourth pin holes H21 and H22 may be formed in adjacent positions, and the fifth and sixth pin holes H31 and H32 may be formed in adjacent positions, but the present invention is not limited thereto.

Among the first to sixth conductor patterns PT11, PT12, PT21, PT22, PT31, and PT32, the first and second conductor patterns PT11 and PT12 may be formed in adjacent positions, the third and fourth conductor patterns PT21 and PT22 may be formed in adjacent positions, and the fifth and sixth conductor patterns PT31 and PT32 may be formed in adjacent positions, but the present invention is not limited thereto.

Among the first to sixth insertion holes IH11, IH12, IH21, IH22, IH31, and IH32, the first and second insertion holes IH11 and IH12 may be formed in adjacent positions, the third and fourth insertion holes IH21 and IH22 may be formed in adjacent positions, and the fifth and sixth insertion holes IH31 and IH32 may be formed in adjacent positions.

The PCB 400 may include a first bootstrap capacitor Cbs1 inserted into the first and second insertion holes IH11 and IH12 so as to be electrically connected to the first and second conductor patterns PT11 and PT12, a second bootstrap capacitor Cbs2 inserted into the third and fourth insertion holes IH13 and IH14 so as to be electrically connected to the third and fourth conductor patterns PT13 and PT14, and a third bootstrap capacitor Cbs3 inserted into the fifth and sixth insertion holes IH15 and IH16 so as to be electrically connected to the first and second conductor patterns PT15 and PT16.

Figure 6:
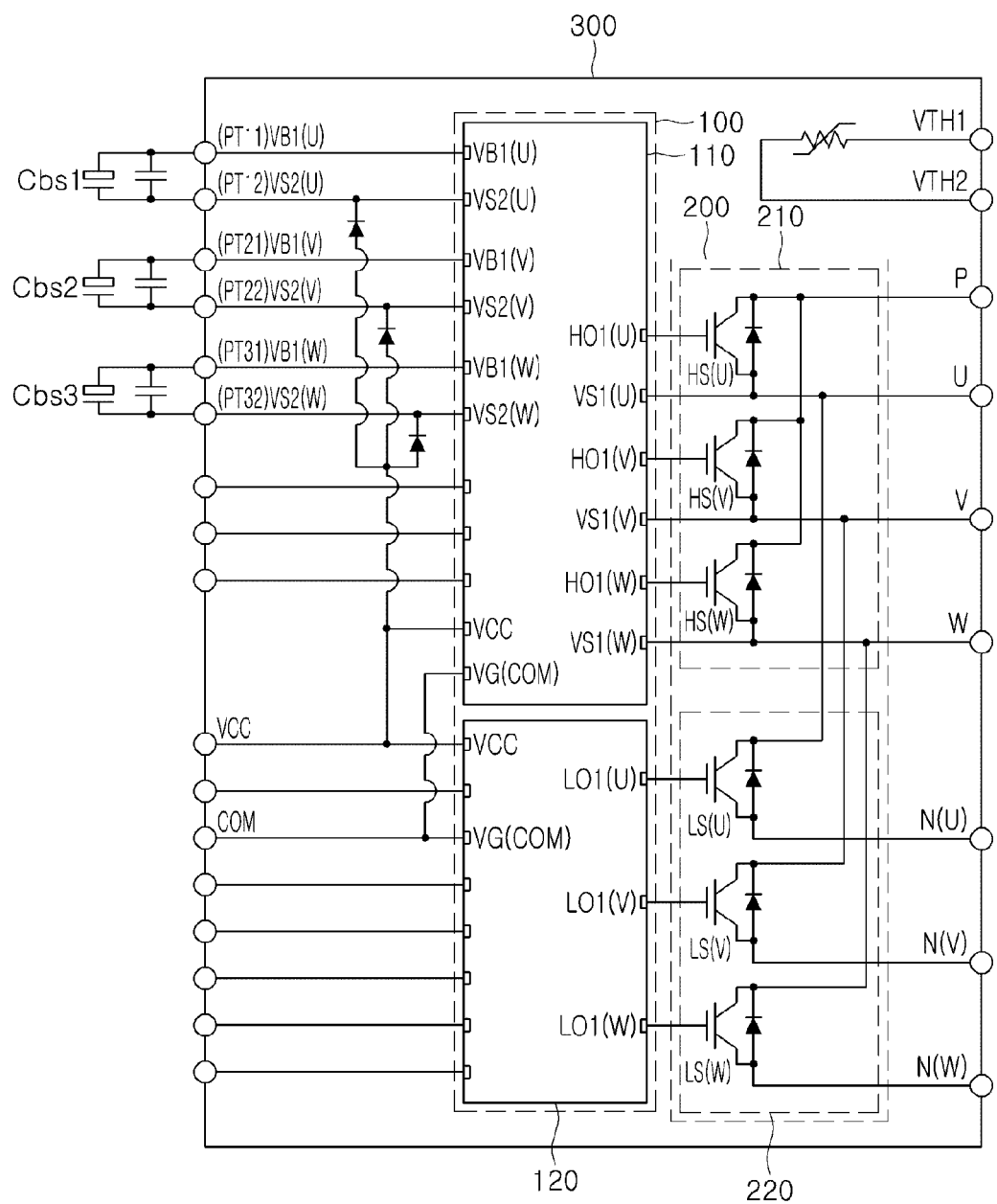
FIG. 6 is a circuit block diagram of the inverter apparatus according to an embodiment of the present invention.

FIG. 6 is a circuit block diagram of the inverter apparatus according to an embodiment of the present invention.

Referring to FIGS. 2 through 6, the inverter apparatus according to an embodiment of the present invention may include the inverter module 300, and the inverter module 300 may include the gate driver circuit 100 and the inverter 200.

The gate driver circuit 100 may include a high side driver 110 having a first output side OTS1 including a certain amount of a plurality of pads formed therein and a first control side CTS1 positioned on the side opposite to the first output side OTS1, including the remainder of the plurality of pads formed therein, and generating a high side gate signal SG10, and a low side driver 120 generating a low side gate signal SG20 by interworking with the high side driver 110.

The inverter 200 may include a high side switch circuit 210 driven by the high side gate signal and a low side switch circuit 220 driven by the low side gate signal.

The high side driver 110 may include a first VS pad VS1 formed on the first output side OTS1, a first output pad HO1 formed on the first output side OTS1, a first VB pad VB1 formed on the first control side CTS1, and a second VS pad VS2 formed to be adjacent to the first VB pad VB1 on the first control side CTS1 and electrically connected to the first VS pad VS1.

The low side driver 120 may include a second output side OTS2 including a certain amount of a plurality of pads formed therein, a second control side CTS2 positioned on the side opposite to the second output side and including the remainder of the plurality of pads formed therein, and a second output pad LO1 formed on the second output side OTS2.

The first VS pad VS1 includes three first VS pads VS1(U), VS1(V), and VS1(W) having a U phase, a V phase, and a W phase corresponding to a U phase, a V phase, and a W phase of a 3-phase inductive load. The first output pad HO1 three first output pads HO1 (U), HO1 (V), and HO1 (W) having a U phase, a V phase, and a W phase. The first VB pad VB1 includes three first VB pads VB1(U), VB1(V), and VB1(W) having a U phase, a V phase, and a W phase. The second VS pad VS2 may include three second VS pads VS2(U), VS2(V), and VS2(W) having a U phase, a V phase, and a W phase. The three second VS pads VS2(U), VS2(V), and VS2(W) of the second VS pad VS2 are formed to be adjacent to the three first VB pads VB1(U), VB1(V), and VB1(W) having the U phase, the V phase, and the W phase and electrically connected to the three first VS pads VS1(U), VS1(V), and VS1(W) having the U phase, the V phase, and the W phase, respectively.

The high side switch circuit 210 may include a high side first switch HS(U) driven by the high side first gate signal SG11, a high side second switch HS(V) driven by the second gate signal SG12, and a high side third switch HS(W) driven by the high side third gate signal SG13.

The low side switch circuit 220 may include a low side first switch LS(U) driven by a low side first gate signal SG21, a low side second switch LS(V) driven by a low side second gate signal SG22, and a low side third switch LS(W) driven by a low side third gate signal SG23.

The PCB may include the first bootstrap capacitor Cbs1, the second bootstrap capacitor Cbs2, and the third bootstrap capacitor Cbs3.

The first bootstrap capacitor Cbs1 is connected between the U-phase first VB pad VB1(U) and the U-phase second VS pad VS2(U) of the high side driver 110. The second bootstrap capacitor Cbs2 is connected between the V-phase first VB pad VB1(V) and the V-phase second VS pad VS2(V) of the high side driver 110. The third bootstrap capacitor Cbs3 is connected between the W-phase first VB pad VB1(W) and the W-phase second VS pad VS2(W) of the high side driver 110.

Meanwhile, since the first bootstrap capacitor Cbs1 is connected between the U-phase first VB pad VB1(U) and the U-phase second VS pad VS2(U), when a high voltage (e.g., 300V) is applied to the emitter terminal of the high side first switch HS(U), a voltage (e.g., 300V+ turn-on voltage) higher by the turn-on voltage than the high voltage may be applied to the gate terminal.

Since the second bootstrap capacitor Cbs2 is connected between the V-phase first VB pad VB1(V) and the V-phase second VS pad VS2(V), when a high voltage (e.g., 300V) is applied to the emitter terminal of the high side second switch HS(V), a voltage (e.g., 300V+ turn-on voltage) higher by the turn-on voltage than the high voltage may be applied to the gate terminal.

Also, since the third bootstrap capacitor Cbs3 is connected between the W-phase first VB pad VB1(W) and the W-phase second VS pad VS2(W), when a high voltage (e.g., 300V) is applied to the emitter terminal of the high side third switch HS(W), a voltage (e.g., 300V+ turn-on voltage) higher by the turn-on voltage than the high voltage may be applied to the gate terminal.

As set forth above, according to embodiments of the invention, in designing the high side driver (or HVIC), the VS pad is added to be adjacent to the VB pad and the VS pin is additionally formed in a position that neighbors to the VB pin of the inverter module, whereby the design of the PCB in which the inverter module is mounted can become easy and simplified, and the size of the PCB can be reduced.

While the present invention has been shown and described in connection with the embodiments, it will be apparent to those skilled in the art that modifications and variations can be made without departing from the spirit and scope of the invention as defined by the appended claims.

What is claimed is:

1. A gate driver circuit comprising:
   a high side driver having a first output side including a certain amount of a plurality of pads formed therein and a first control side positioned on the side opposite to the first output side and including the remainder of the plurality of pads formed therein, and generating a high side gate signal; and
   a low side driver generating a low side gate signal by interworking with the high side driver,
   wherein the high side driver comprises:
   a first VS pad formed on the first output side;
   a first output pad formed on the first output side;
   a first VB pad formed on the first control side;
   a second VS pad formed to be adjacent to the first VB pad on the first control side and electrically connected to the first VS pad; and
   a first circuit unit connected to the plurality of pads including the first VB pad, the first output pad, the first VS pad, and the second VS pad, and providing the high side gate signal through the first output pad,
   wherein the second VS pad is electrically connected to the first VS pad through an internal line of the first circuit unit.

2. The gate driver circuit of claim 1, wherein the low side driver comprises:
   a second output side including a certain amount of a plurality of pads formed therein;
   a second control side positioned on the side opposite to the second output side and including the remainder of the plurality of pads formed therein;
   a second output pad formed on the second output side; and
   a second circuit unit connected to the plurality of pads including the second output pad and providing the low side gate signal through the second output pad.

3. The gate driver circuit of claim 1, wherein the first VS pad includes three first VS pads having a U phase, a V phase, and a W phase corresponding to a U phase, a V phase, and a W phase of a 3-phase inductive load, respectively,
   the first output pad includes three first output pads having a U phase, a V phase, and a W phase,
   the first VB pad includes three first VB pads having a U phase, a V phase, and a W phase, and
   the second VS pad includes three second VS pads formed to be adjacent to the three first VB pads having the U phase, the V phase, and the W phase and electrically connected thereto, respectively.

4. The gate driver circuit of claim 3, wherein the first circuit unit comprises:
   a first circuit unit connected to the U-phase first VB pad, first output pad, first VS pad, and second VS pad and providing a high side first gate signal, among the high side gate signals, through the U-phase first output pad;
   a second circuit unit connected to the V-phase first VB pad, first output pad, first VS pad, and second VS pad and providing a high side second gate signal, among the high side gate signals, through the V-phase first output pad; and a third circuit unit connected to the W-phase first VB pad, first output pad, first VS pad, and second VS pad and providing a high side third gate signal, among the high side gate signals, through the W-phase first output pad.

5. The gate driver circuit of claim 4, wherein the first circuit unit includes a first switch element formed between the U-phase first VB pad and the U-phase first output pad and a second switch element formed between the U-phase first output pad and the U-phase first VS pad,
the second circuit unit includes a third switch element formed between the V-phase first VB pad and the V-phase first output pad and a fourth switch element formed between the V-phase first output pad and the V-phase first VS pad, and
the third circuit unit includes a fifth switch element formed between the W-phase first VB pad and the W-phase first output pad and a sixth switch element formed between the W-phase first output pad and the W-phase first VS pad.

6. An inverter module comprising:
a gate driver circuit including a high side driver having a first output side including a certain amount of a plurality of pads formed therein and a first control side positioned on the side opposite to the first output side and including the remainder of the plurality of pads formed therein, and generating a high side gate signal, and a low side driver generating a low side gate signal by interworking with the high side driver; and
an inverter including a high side switch circuit driven by the high side gate signal and a low side switch circuit driven by the low side gate signal,
wherein the high side driver comprises:
a first VS pad formed on the first output side;
a first output pad formed on the first output side;
a first VB pad formed on the first control side;
a second VS pad formed to be adjacent to the first VB pad on the first control side and electrically connected to the first VS pad; and
a first circuit unit connected to the plurality of pads including the first VB pad, the first output pad, the first VS pad, and the second VS pad, and providing the high side gate signal through the first output pad,
wherein the second VS pad is electrically connected to the first VS pad through an internal line of the first circuit unit.

7. The inverter module of claim 6, wherein the low side driver comprises:
a second output side including a certain amount of a plurality of pads formed therein;
a second control side positioned on the side opposite to the second output side and including the remainder of the plurality of pads formed therein;
a second output pad formed on the second output side; and
a second circuit unit connected to the plurality of pads including the second output pad and providing the low side gate signal through the second output pad.

8. The inverter module of claim 6, wherein the first VS pad includes three first VS pads having a U phase, a V phase, and a W phase corresponding to a U phase, a V phase, and a W phase of a 3-phase inductive load, respectively,
the first output pad includes three first output pads having a U phase, a V phase, and a W phase,
the first VB pad includes three first VB pads having a U phase, a V phase, and a W phase, and
the second VS pad includes three second VS pads formed to be adjacent to the three first VB pads having the U phase, the V phase, and the W phase and electrically connected thereto, respectively.

9. The inverter module of claim 8, wherein the circuit unit comprises:
a first circuit unit connected to the U-phase first VB pad, first output pad, first VS pad, and second VS pad and providing a high side first gate signal, among the high side gate signals, through the U-phase first output pad;
a second circuit unit connected to the V-phase first VB pad, first output pad, first VS pad, and second VS pad and providing a high side second gate signal, among the high side gate signals, through the V-phase first output pad; and
a third circuit unit connected to the W-phase first VB pad, first output pad, first VS pad, and second VS pad and providing a high side third gate signal, among the high side gate signals, through the W-phase first output pad.

10. The inverter module of claim 9, wherein the high side switch circuit comprises:
a high side first switch driven by the high side first gate signal;
a high side second switch driven by the high side second gate signal; and
a high side third switch driven by the high side third gate signal.

11. The inverter module of claim 9, wherein the first circuit unit includes a first switch element formed between the U-phase first VB pad and the U-phase first output pad and a second switch element formed between the U-phase first output pad and the U-phase first VS pad,
the second circuit unit includes a third switch element formed between the V-phase first VB pad and the V-phase first output pad and a fourth switch element formed between the V-phase first output pad and the V-phase first VS pad, and
the third circuit unit includes a fifth switch element formed between the W-phase first VB pad and the W-phase first output pad and a sixth switch element formed between the W-phase first output pad and the W-phase first VS pad.

12. The inverter module of claim 9, wherein the inverter module comprises:
a plurality of lead frames electrically connected to the plurality of pads including the first VB pad, the first output pad, the first VS pad, and the second VS pad through conducting wires, respectively; and
a plurality of pins directly electrically connected to the plurality of lead frames, respectively, and formed in an end portion of the inverter module.

13. The inverter module of claim 12, wherein the first and second lead frames connected to the U-phase first VB pad and second VS pad, respectively, among the plurality of lead frames, are formed in adjacent positions,
the third and fourth lead frames connected to the V-phase first VB pad and second VS pad, respectively, among the plurality of lead frames, are formed in adjacent positions, and
the fifth and sixth lead frames connected to the W-phase first VB pad and second VS pad, respectively, among the plurality of lead frames, are formed in adjacent positions.

14. The inverter module of claim 13, wherein first and second pins connected to the first and second lead frames, respectively, among the plurality of pins, are formed in adjacent positions, third and fourth pins connected to the third and fourth lead frames, respectively, among the plurality of pins, are formed in adjacent positions, and fifth and sixth pins connected to the fifth and sixth lead frames, respectively, among the plurality of pins, are formed in adjacent positions.

15. An inverter apparatus comprising:

an inverter module generating a driving signal of an inductive load; and a printed circuit board (PCB) on which the inverter module is mounted, wherein the inverter module comprises:

a gate driver circuit including a high side driver having a first output side including a certain amount of a plurality of pads formed therein and a first control side positioned on the side opposite to the first output side and including the remainder of the plurality of pads formed therein, and generating a high side gate signal, and a low side driver generating a low side gate signal by interworking with the high side driver; and an inverter including a high side switch circuit driven by the high side gate signal and a low side switch circuit driven by the low side gate signal, wherein the high side driver comprises:

a first VS pad formed on the first output side;

a first output pad formed on the first output side;

a first VB pad formed on the first control side;

a second VS pad formed to be adjacent to the first VB pad on the first control side and electrically connected to the first VS pad; and a first circuit unit connected to the plurality of pads including the first VB pad, the first output pad, the first VS pad, and the second VS pad, and providing the high side gate signal through the first output pad, wherein the second VS pad is electrically connected to the first VS pad through an internal line of the first circuit unit.

16. The inverter apparatus of claim 15, wherein the low side driver comprises:

a second output side including a certain amount of a plurality of pads formed therein;

a second control side positioned on the side opposite to the second output side and including the remainder of the plurality of pads formed therein;

a second output pad formed on the second output side; and a second circuit unit connected to the plurality of pads including the second output pad and providing the low side gate signal through the second output pad.

17. The inverter apparatus of claim 15, wherein the first VS pad includes three first VS pads having a U phase, a V phase, and a W phase corresponding to a U phase, a V phase, and a W phase of a 3-phase inductive load, respectively, the first output pad includes three first output pads having a U phase, a V phase, and a W phase, the first VB pad includes three first VB pads having a U phase, a V phase, and a W phase, and the second VS pad includes three second VS pads formed to be adjacent to the three first VB pads having the U phase, the V phase, and the W phase and electrically connected thereto, respectively.

18. The inverter apparatus of claim 17, wherein the circuit unit comprises:

a first circuit unit connected to the U-phase first VB pad, first output pad, first VS pad, and second VS pad and providing a high side first gate signal, among the high side gate signals, through the U-phase first output pad;

a second circuit unit connected to the V-phase first VB pad, first output pad, first VS pad, and second VS pad and providing a high side second gate signal, among the high side gate signals, through the V-phase first output pad; and a third circuit unit connected to the W-phase first VB pad, first output pad, first VS pad, and second VS pad and providing a high side third gate signal, among the high side gate signals, through the W-phase first output pad.

19. The inverter apparatus of claim 18, wherein the high side switch circuit comprises:

a high side first switch driven by the high side first gate signal;

a high side second switch driven by the high side second gate signal; and a high side third switch driven by the high side third gate signal.

20. The inverter apparatus of claim 18, wherein the first circuit unit includes a first switch element formed between the U-phase first VB pad and the U-phase first output pad and a second switch element formed between the U-phase first output pad and the U-phase first VS pad, the second circuit unit includes a third switch element formed between the V-phase first VB pad and the V-phase first output pad and a fourth switch element formed between the V-phase first output pad and the V-phase first VS pad, and the third circuit unit includes a fifth switch element formed between the W-phase first VB pad and the W-phase first output pad and a sixth switch element formed between the W-phase first output pad and the W-phase first VS pad.

21. The inverter apparatus of claim 18, wherein the inverter module comprises:

a plurality of lead frames electrically connected to the plurality of pads including the first VB pad, the first output pad, the first VS pad, and the second VS pad through conducting wires, respectively; and a plurality of pins directly electrically connected to the plurality of lead frames, respectively, and formed in an end portion of the inverter module.

22. The inverter apparatus of claim 21, wherein the first and second lead frames connected to the U-phase first VB pad and second VS pad, respectively, among the plurality of lead frames, are formed in adjacent positions, the third and fourth lead frames connected to the V-phase first VB pad and second VS pad, respectively, among the plurality of lead frames, are formed in adjacent positions, and the fifth and sixth lead frames connected to the W-phase first VB pad and second VS pad, respectively, among the plurality of lead frames, are formed in adjacent positions.

23. The inverter apparatus of claim 22, wherein first and second pins connected to the first and second lead frames, respectively, among the plurality of pins, are formed in adjacent positions, third and fourth pins connected to the third and fourth lead frames, respectively, among the plurality of pins, are formed in adjacent positions, and fifth and sixth pins connected to the fifth and sixth lead frames, respectively, among the plurality of pins, are formed in adjacent positions.

24. The inverter apparatus of claim 23, wherein the PCB comprises:

a plurality of pin holes into which the plurality of pins are inserted to be electrically connected;

first to sixth conductor patterns electrically connected to first o sixth pin holes, respectively, among the plurality of pin holes; and first to sixth insertion holes electrically connected to the first to sixth conductor patterns.

25. The inverter apparatus of claim 24, wherein the PCB comprises:

a first bootstrap capacitor inserted into the first and second insertion holes so as to be electrically connected to the first and second conductor patterns;

a second bootstrap capacitor inserted into the third and fourth insertion holes so as to be electrically connected to the third and fourth conductor patterns; and a third bootstrap capacitor inserted into the fifth and sixth insertion holes so as to be electrically connected to the fifth and sixth conductor patterns.

\* \* \* \* \*